United States Patent
Wang et al.

(10) Patent No.: US 11,768,975 B1
(45) Date of Patent: Sep. 26, 2023

(54) AUTOMATIC MODELING METHOD FOR USER-DEFINED VEHICLE CONTROLLER

(71) Applicants: CATARC AUTOMOTIVE TEST CENTER (TIANJIN) CO., LTD., Tianjin (CN); CHINA AUTOMOTIVE TECHNOLOGY AND RESEARCH CENTER CO., LTD., Tianjin (CN)

(72) Inventors: Wei Wang, Tianjin (CN); Yan Yan, Tianjin (CN); Wenbo Li, Tianjin (CN); Fufan Qv, Tianjin (CN); Hong Zheng, Tianjin (CN); Xiaohui Zhang, Tianjin (CN); Changqing Wang, Tianjin (CN); Maodong Fang, Tianjin (CN)

(73) Assignees: CATARC AUTOMOTIVE TEST CENTER (TIANJIN) CO., LTD., Tianjin (CN); CHINA AUTOMOTIVE TECHNOLOGY AND RESEARCH CENTER CO., LTD., Tianjin (CN)

( * ) Notice: Subject to any disclaimer, the term of this patent is extended or adjusted under 35 U.S.C. 154(b) by 0 days.

(21) Appl. No.: 18/183,185

(22) Filed: Mar. 14, 2023

Related U.S. Application Data

(63) Continuation of application No. PCT/CN2022/131799, filed on Nov. 15, 2022.

(30) Foreign Application Priority Data

Mar. 22, 2022 (CN) .......................... 202210279421.7

(51) Int. Cl.
 *G06F 30/15* (2020.01)
 *G06F 30/12* (2020.01)

(52) U.S. Cl.
 CPC .............. *G06F 30/15* (2020.01); *G06F 30/12* (2020.01)

(58) Field of Classification Search
 CPC ........... G06F 30/00; G06F 30/15; G06F 30/12
 (Continued)

(56) References Cited

U.S. PATENT DOCUMENTS

| 10,053,090 | B2 | 8/2018 | Büschenfeld et al. |
| 10,168,703 | B1 * | 1/2019 | Konrardy ............... G08G 1/205 |
| 2021/0349459 | A1 | 11/2021 | Tuang et al. |

FOREIGN PATENT DOCUMENTS

| CN | 111913405 A | * 11/2020 |
| CN | 111913405 A | 11/2020 |

(Continued)

*Primary Examiner* — Cedric Johnson
(74) *Attorney, Agent, or Firm* — True Shepherd LLC; Andrew C. Cheng

(57) ABSTRACT

An automatic modeling method for a user-defined vehicle controller includes: configuring a component model; generating a description file; summarizing component input and output signals/parameters; and creating the user-defined vehicle controller. A template and data required by the user is provided to automatically build a vehicle controller port model, and a vehicle controller policy model framework to assist the user to quickly and flexibly build the vehicle controller model is provided. The problem of low efficiency in building various user-defined vehicle controller models for different vehicle types is solved. The user develops a vehicle controller policy model under the given model framework, and the model can run directly without additional configuration of port signals. The user can modify the vehicle controller policy model online in real time, which solves the problem that the application configuration of the vehicle controller is complex and cannot be updated online in real time.

6 Claims, 5 Drawing Sheets

(58) Field of Classification Search
USPC .......................................................... 703/8, 6
See application file for complete search history.

(56) References Cited

FOREIGN PATENT DOCUMENTS

| | | | | |
|---|---|---|---|---|
| CN | 112507449 | A | | 3/2021 |
| CN | 112883587 | A | * | 6/2021 |
| CN | 112883587 | A | | 6/2021 |
| CN | 113434952 | A | | 9/2021 |
| CN | 114491722 | A | * | 5/2022 |
| CN | 114491722 | A | | 5/2022 |
| WO | 2019169421 | A | | 9/2019 |
| WO | WO-2019169421 | A1 | * | 9/2019 |

* cited by examiner

AUTOMATIC MODELING METHOD FOR USER-DEFINED VEHICLE CONTROLLER

CROSS-REFERENCE TO RELATED APPLICATIONS

This application is a continuation of International Patent Application No. PCT/CN2022/131799 with a filing date of Nov. 15, 2022, designating the United States, now pending, and further claims priority to Chinese Patent Application No. 202210279421.7 with a filing date of Mar. 22, 2022. The content of the aforementioned applications, including any intervening amendments thereto, are incorporated herein by reference.

TECHNICAL FIELD

The present disclosure belongs to the field of vehicle performance simulation, and in particular to an automatic modeling method for a user-defined vehicle controller.

BACKGROUND

Vehicle simulation technology plays an increasingly important role in vehicle development. Building a reasonable vehicle simulation model through a simulation platform to conduct preliminary performance simulation research at the vehicle development stage can significantly improve the vehicle development efficiency and shorten the research and development cycle. At present, the hottest research topic is the development and verification of vehicle controller models built by users.

Vehicle controller modeling involves two parts, namely vehicle controller port model and control policy model. At present, mainstream simulation platforms provide different support for vehicle controller modeling, but they are basically in the following two forms. 1. A vehicle controller model is built in the platform, and users select the vehicle controller model according to their needs. However, the type of the vehicle controller is fixed, which is hard to meet the control requirements of users for different vehicle types and different functions. 2. The platform itself cannot build a vehicle controller model, but it provides an open vehicle controller port, allowing users to convert vehicle controllers they build on other platforms into recognizable blocks according to the port rule of the platform and import them into the platform. However, the operation process is cumbersome, with complex configuration, many error-prone intermediate tasks, and the need for reconfiguration for each modification of the vehicle controller. Therefore, an automatic modeling method is needed to help users complete the port model template part of the vehicle controller model. After the port model part is completed, users complete the control policy model according to their control requirements. This facilitates the rapid building of the vehicle controller prototype, and facilitates comprehensive preliminary verification, thus greatly improving the development efficiency of the vehicle controller.

However, at present, there are few automatic modeling methods that meet the user-defined requirements. Therefore, it is necessary to provide an automatic modeling method for a user-defined vehicle controller so as to overcome the shortcomings of the prior art.

SUMMARY OF PRESENT INVENTION

In view of this, an objective of the present disclosure is to propose an automatic modeling method for a user-defined vehicle controller. The present disclosure can help users complete the configuration of a vehicle controller port model and complete the building of a control policy model according to vehicle control requirements, so as to realize efficient and accurate modeling of user-defined vehicle controllers for different users.

To achieve the above objective, the present disclosure adopts the following technical solution.

The automatic modeling method for a user-defined vehicle controller includes the following steps:

S1: selecting and configuring, on a graphical user interface (GUI) of a vehicle simulation platform, all component models of a vehicle model except a vehicle controller, and completing component connection and parameter configuration;

S2: generating a component model description file and a component model parameter description file based on the component models configured in step S1;

S3: summarizing input signals and output signals of the component models based on the component model description file generated in step S2, and obtaining an input signal set and an output signal set;

S4: calculating a difference set between the input signal set and the output signal set obtained in step S3, wherein the difference set is an unmatched demand input signal set in all the component models of the vehicle model except the vehicle controller selected in step S1, and the unmatched demand input signal set is defined as an output signal set of the user-defined vehicle controller;

S5: taking the output signal set in step S4 as an alternative input signal set of the user-defined vehicle controller; and selecting, by a user, any number of signals as input signals of the user-defined vehicle controller;

S6: summarizing, based on the component model parameter description file generated in step S2, parameter names in the component model parameter description file into a parameter set for building the user-defined vehicle controller; and selecting, by the user, any number of parameters in the parameter set as demand parameters of the user-defined vehicle controller;

S7: creating a port model template on the vehicle simulation platform based on steps S4 and S5; creating a control policy model template based on the demand parameters of the user-defined vehicle controller selected in step S6 and an actual need of the user; and completing first creation of the user-defined vehicle controller based on the port model template and the control policy model template; and S8: checking, after the first creation of the user-defined vehicle controller is completed, input signal configuration of the user-defined vehicle controller before each overall vehicle simulation covering all components.

Further, in step S1, the vehicle simulation platform is plug-and-play, modularizes the component models, and includes the GUI for placing and connecting demand components.

Further, in step S2, the component models each include the input signals, the output signals, and parameters; the component model description file refers to a filet that describes the input signals and output signals of the component models; and the component model parameter description file refers to a file that describes parameters for ensuring normal operation of the component models and basic attributes of all the parameters.

Further, in step S4, the unmatched demand input signal means that a demand input signal of a component is not provided by an output signal of any other component.

Further, in step S7, the creating a port model template includes:

A1: determining input and output serial numbers and input and output names of the port model template according to the output signal set of the user-defined vehicle controller obtained in step S4 and the input signals of the user-defined vehicle controller selected by the user in step S5;

A2: connecting, based on step A1, signals of a same name between all the components except the vehicle controller and the port model template, and completing the creation of the port model template; and A3: saving the port model template.

Further, in step S8, the checking input signal configuration of the user-defined vehicle controller before each overall vehicle simulation covering all components includes:

B1: summarizing current input signals of the user-defined vehicle controller;

B3: determining, based on step B1, whether current input signal configuration of the user-defined vehicle controller is consistent with previous configuration; and B4: if there is no difference in the input signal configuration, not operating, and simulating based on an original user-defined vehicle controller; and if an input signal is added, deleted or replaced, modifying the input signals of the built user-defined vehicle controller automatically and synchronously, and not deleting the control policy model template freely built by the user according to the actual need in step S7.

Compared with the prior art, in the present disclosure, the automatic modeling method for a user-defined vehicle controller has the following the advantages:

(1) In the present disclosure, the automatic modeling method for a user-defined vehicle controller is reasonably designed. The present disclosure automatically creates the vehicle controller model template according to the configurations of all the component models except the vehicle controller, and provides all available parameters of all the component models except the vehicle controller as modeling data. The present disclosure provides the template and data required by the user to automatically build the vehicle controller port model, and provides the vehicle controller policy model framework to assist the user to quickly and flexibly build the vehicle controller model. The present disclosure solves the problem of low efficiency in building various user-defined vehicle controller models for different vehicle types. The user develops the vehicle controller policy model under the given model framework, and the model can run directly without additional configuration of port signals. In addition, the user can modify the vehicle controller policy model online in real time, which solves the problem that the application configuration of the vehicle controller is complex and cannot be updated online in real time.

BRIEF DESCRIPTION OF THE DRAWINGS

As a part of the present disclosure, the drawings of the specification provide further understanding of the present disclosure. The schematic embodiments of the present disclosure and description thereof are intended to explain the present disclosure and are not intended to constitute an improper limitation to the present disclosure. In the drawings.

DETAILED DESCRIPTION OF THE EMBODIMENTS

Figure 1:
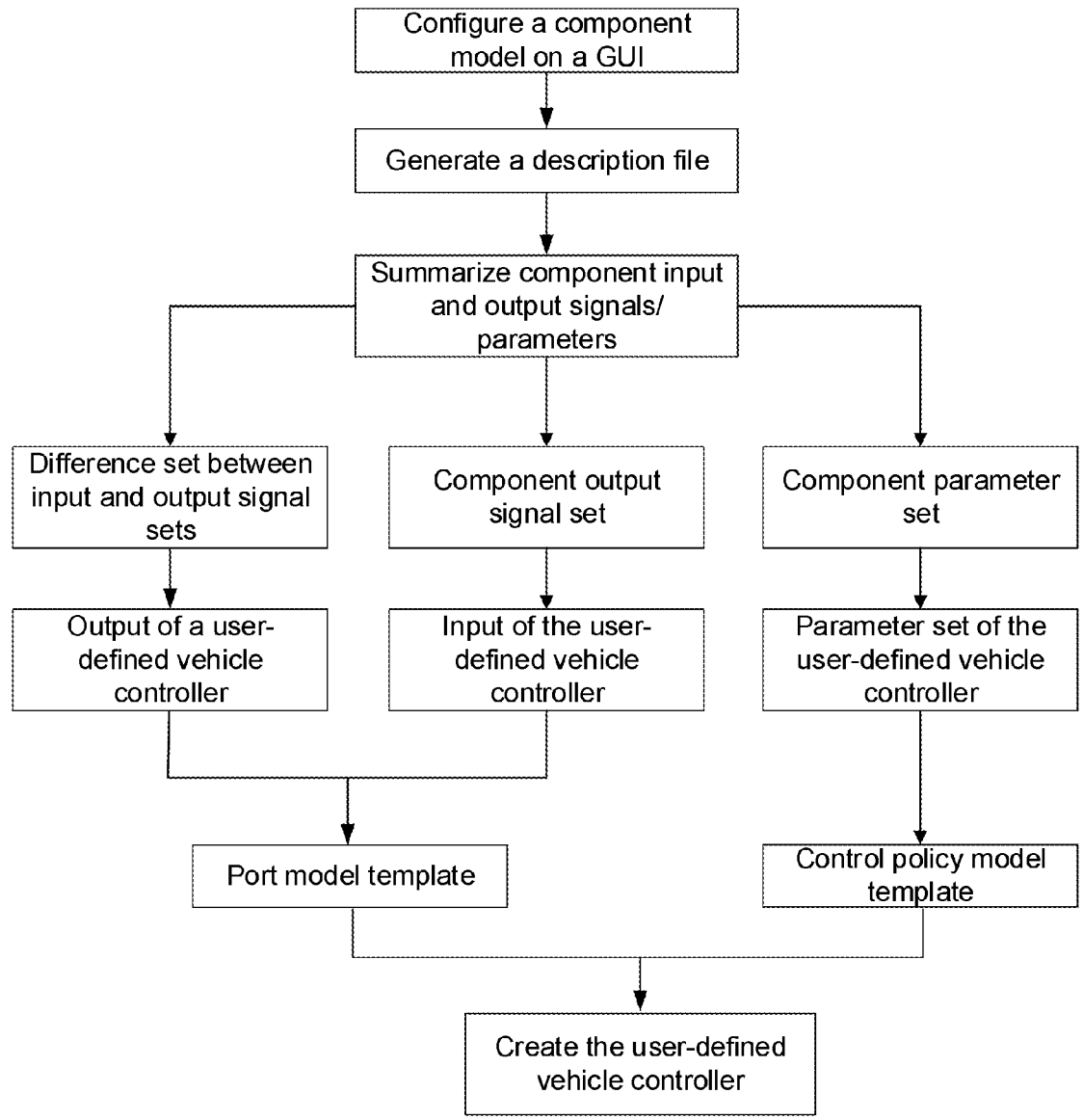
FIG. 1 is a flowchart of an automatic modeling method for a user-defined vehicle controller according to an embodiment of the present disclosure.

It should be noted that the embodiments in the present disclosure or features in the embodiments may be combined in a non-conflicting manner.

It should be understood that in the description of the present disclosure, terms such as "central", "longitudinal", "transverse", "upper", "lower", "front", "rear", "left", "right", "vertical", "horizontal", "top", "bottom", "inside" and "outside" indicate the orientation or positional relationships based on the drawings. They are merely intended to facilitate and simplify the description of the present disclosure, rather than to indicate or imply that the mentioned device or components must have a specific orientation or must be constructed and operated in a specific orientation. Therefore, these terms should not be construed as a limitation to the present disclosure. Moreover, the terms such as "first" and "second" are used only for the purpose of description and cannot be understood as indicating or implying relative importance or implicitly indicating the number of technical features denoted. Thus, features defined with "first" and "second" may explicitly or implicitly include one or more of the features. In the description of the present disclosure, unless otherwise specified, "a plurality of" means at least two.

In the description of the present disclosure, it should be noted that, unless otherwise clearly specified, meanings of terms "install", "connected with", and "connected to" should be understood in a board sense. For example, the connection may be a fixed connection, a removable connection, or an integral connection; may be a mechanical connection or an electrical connection; may be a direct connection or an indirect connection by using an intermediate medium; or may be intercommunication between two components. A person of ordinary skill in the art may understand specific meanings of the above terms in the present disclosure based on a specific situation.

The present disclosure will be described in detail below with reference to the drawings and the embodiments.

As shown in FIGS. 1 to 5, the present disclosure provides an automatic modeling method for a user-defined vehicle controller, including the following steps:

S1. On a graphical user interface (GUI) of a vehicle simulation platform, all component models of a vehicle model except a vehicle controller are selected and configured, and component connection and parameter configuration are completed.

S2. A component model description file and a component model parameter description file are generated based on the component models configured in step S1.

S3. Input signals and output signals of the component models are summarized based on the component model description file generated in step S2, and an input signal set and an output signal set are obtained. In this embodiment, according to a recording rule of the component model description file, the input signals of the component models are summarized as the input signal set, and the output signals of the component models are summarized as the output signal set.

In step S3, when the input and output signals of the component models are summarized, directly related to the recording rule of the component model description file, the information of a specified attribute can be obtained in any way according to the recording rule, including but not limited to node extraction, regular expression search, etc. After the input and output signal sets of all components are obtained, it is necessary to detect duplicate values of the set and delete all duplicate values. The sequence of signals does not affect subsequent processing.

S4. A difference set between the input signal set and the output signal set obtained in step S3 is calculated, the difference set is an unmatched demand input signal set in all the component models of the vehicle model except the vehicle controller selected in step S1, and the unmatched demand input signal set is defined as an output signal set of the user-defined vehicle controller.

S5. The output signal set in step S4 is taken as an alternative input signal set of the user-defined vehicle controller; and a user selects any number of signals as input signals of the user-defined vehicle controller.

S6. Based on the component model parameter description file generated in step S2, parameter names in the component model parameter description file are summarized into a parameter set for building the user-defined vehicle controller; and the user selects any number of parameters in the parameter set as demand parameters of the user-defined vehicle controller.

S7. A port model template is created on the vehicle simulation platform based on steps S4 and S5. A control policy model template is created based on the demand parameters of the user-defined vehicle controller selected in step S6 and an actual need of the user. If the user needs to output a brake force through a brake pedal opening via the user-defined vehicle controller, the control policy model template is built in the vehicle controller according to a linear relationship between the brake pedal opening and the brake force. Based on the port model template and the control policy model template, first creation of the user-defined vehicle controller is completed. In this embodiment, the port model template is automatically created according to the input signal of the user-defined vehicle controller selected by the user and the automatically added output signal. According to a parameter set, the control policy model template is created based on a control policy required by user, so as to build the controller freely. The control policy is a prior art and can be customized according to a user need.

S8. After the first creation of the user-defined vehicle controller is completed, input signal configuration of the user-defined vehicle controller is checked before each overall vehicle simulation covering all components. In this embodiment, after vehicle the first creation of vehicle-defined vehicle controller, the input signal configuration of the user-defined vehicle controller is checked before each overall vehicle simulation covering all components.

The automatic modeling method for a user-defined vehicle controller is reasonably designed. This method realizes automatic modeling according to a current component configuration, and allows the user to build the vehicle controller freely, which solves the problem of building user-defined vehicle controllers for different users. Through the technology of automatically sorting input and output signals and automatically generating models, the user can directly run the policy after building it. The design does not require an additional configuration, and can modify the vehicle controller model online in real time, which solves the problem that the vehicle controller application configuration is complex and cannot be updated online in real time.

In step S1, the vehicle simulation platform is plug-and-play, modularizes the component models, and includes the GUI for placing and connecting demand components. In this embodiment, in step S1, the vehicle simulation platform is plug-and-play, modularizes the component models, and includes the GUI for placing and connecting demand components. For example, it may be Cruise or Amesim, etc. The vehicle controller includes two parts, namely a port model template and a control policy model template. The port model template includes the input signals and output signals of the user-defined vehicle controller model. The control policy model template includes model parameters. Connection of component signals refers to definition and confirmation of a connection relationship between all the component models according to the actual configuration of a vehicle and a component connection rule of the vehicle simulation platform. Parameter configuration refers to configuration of all parameters involved in the model that affect the dynamic performance of the components.

In step S2, the component models each include the input signals, the output signals, and parameters; the component model description file refers to a filet that describes the input signals and output signals of the component models; and the component model parameter description file refers to a file that describes parameters for ensuring normal operation of the component models and basic attributes of all the parameters. In this embodiment, in step S2, the component model description file refers to a file that describes the input and output port signals of the component model, model hierarchy, and other key information. The component model parameter description file refers to a file that describes all necessary parameters for ensuring the normal operation of the component model and describes basic attributes of all parameters, such as parameter name, display name, parameter type, unit, storage format, parameter source, and other key information. The description file is in any form that can record the features to be described and is easy to find, such as XML, or TXT.

In step S4, the unmatched demand input signal means that a demand input signal of a component is not provided by the output signal of any other component. In this embodiment, in step S4, the unmatched demand input signal means that a demand input signal of a component is not provided by the output signal of any other component. According to a rule of general simulation modeling, the simulation cannot be performed when the input is missing. The unmatched demand input signal serves as the output signal of the user-defined vehicle controller to form a closed loop of the signal, so as to realize automatic collection of the output signal of the vehicle controller.

In step S7, the port model template is created as follows.

A1. Input and output serial numbers and input and output names of the port model template are determined according to the output signal set of the user-defined vehicle controller obtained in step S4 and the input signals of the user-defined vehicle controller selected by the user in step S5.

A2. Based on step A1, signals of a same name between all the components except the vehicle controller and the port model template are connected, and the creation of the port model template is completed.

A3. The port model template is saved.

Figure 2:
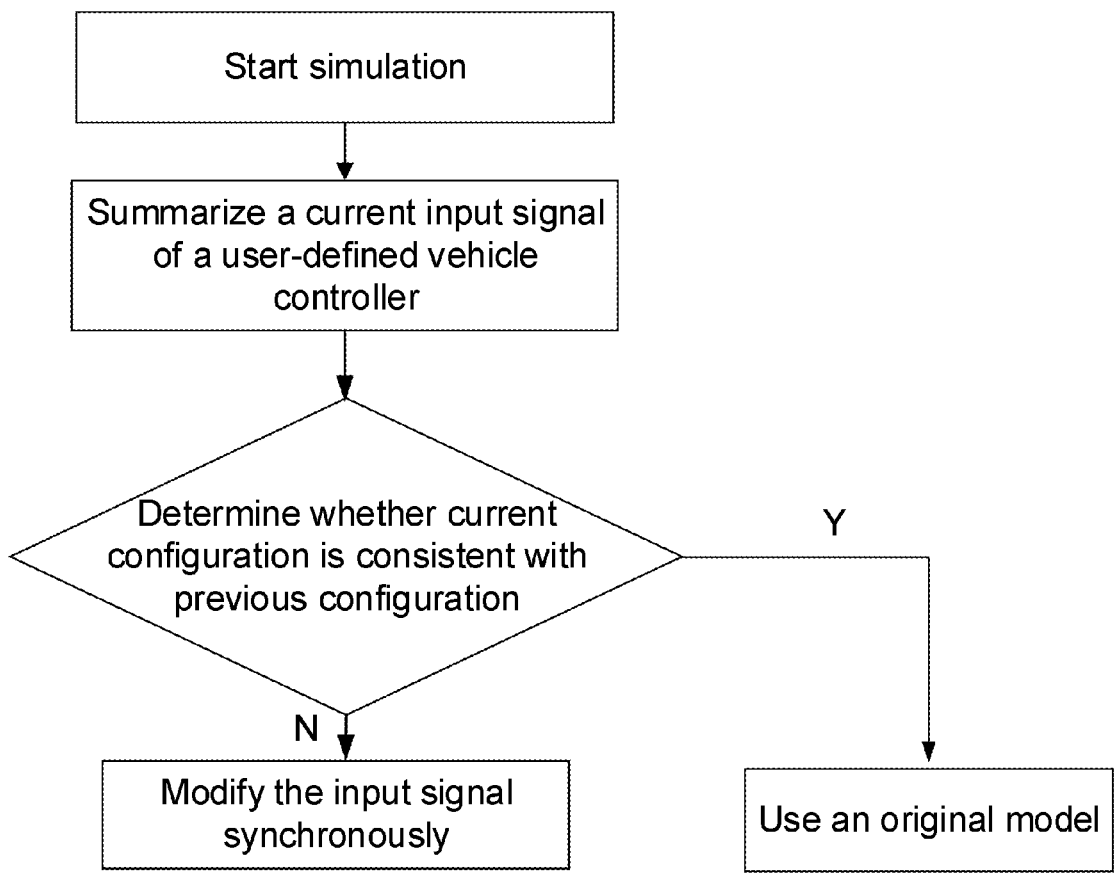
FIG. 2 is a flowchart for processing the user-defined vehicle controller at the beginning of a simulation according to an embodiment of the present disclosure.

As shown in FIG. 2, in step S8, the input signal configuration of the user-defined vehicle controller is checked before each overall vehicle simulation covering all components.

B1. Current input signals of the user-defined vehicle controller are summarized.

B3. Based on step B1, it is determined whether current input signal configuration of the user-defined vehicle controller is consistent with previous configuration.

B4. If there is no difference in the input signal configuration, no operation is performed, and simulation is performed based on an original user-defined vehicle controller. If an input signal is added, deleted or replaced, the input signals of the built user-defined vehicle controller are modified automatically and synchronously, and the control policy model template freely built by the user according to the actual need in step S7 is not deleted.

Embodiment

Figure 3:
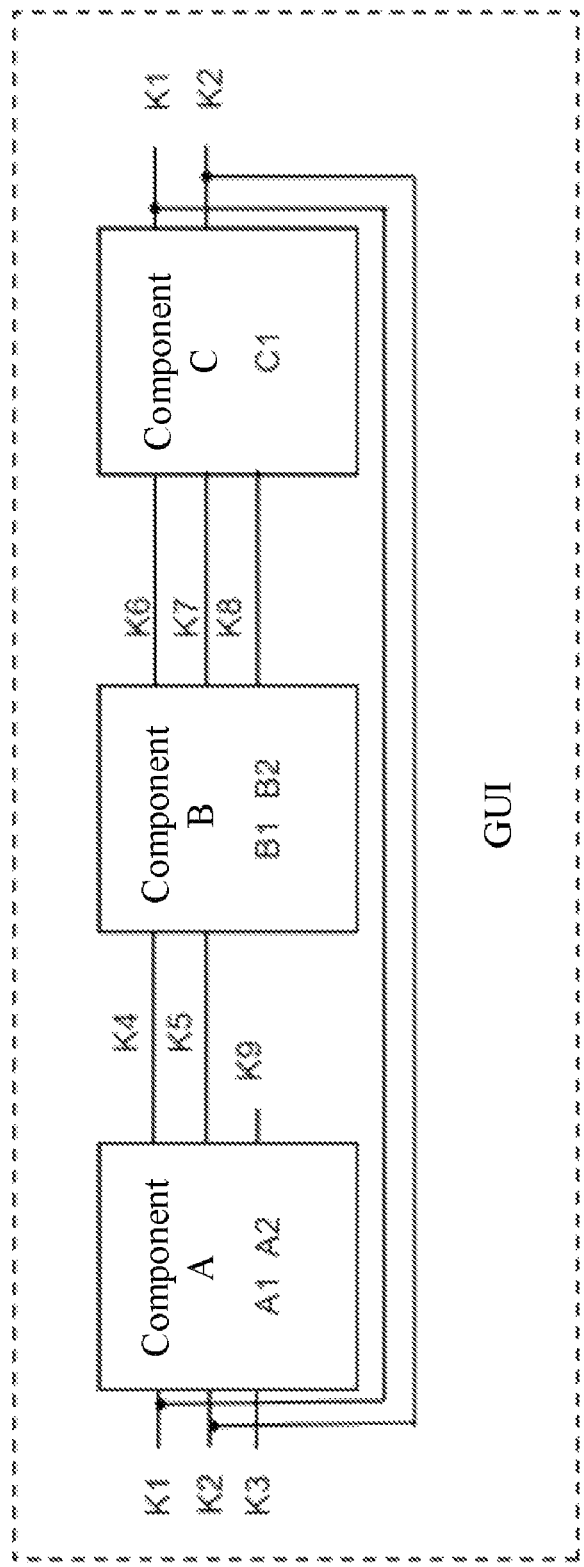
FIG. 3 is a schematic diagram of port configuration and component signals according to an embodiment of the present disclosure.

In the present disclosure, to more clearly explain the automatic modeling method for a user-defined vehicle controller, as shown in FIG. 3, it is assumed that components A, B, and C are built on the GUI of the vehicle simulation platform. In the model of the component A, the input signals are K1, K2, and K3, the output signals are K4, K5, and K9, and the parameters are A1 and A2. In the model of the component B, the input signals are K4 and K5, the output signals are K6, K7, and K8, and the parameters are B1 and B2. In the model of the component C, the input signals are K6, K7, and K8, the output signals are K1 and K2, and the parameter is C1. According to the components A, B, and C, a user-defined vehicle controller is automatically created as follows.

S1. The components A, B, and C are selected and configured on the GUI of the vehicle simulation platform, and the component connection and related parameter configuration are completed.

S2. A description file is created for the models of the components A, B, and C in the following format (but not necessarily in the following format):

<Template ModleName="model name">
<Port   PortKind="input"   Num="number" PortName="port name" PortUnit="unit"/Port>
...
<Port   PortKind="Output"   Num="number" PortName="port name" PortUnit="unit"/Port>
...
</Template>

A description file is created for the parameters of the components A, B, and C in the following format (but not necessarily in the following format):

<Template ModleName="model name">
<Param Num="number" ParamName="parameter name" ParamUnit="unit"/Param>
...
</Template>

Figure 4:
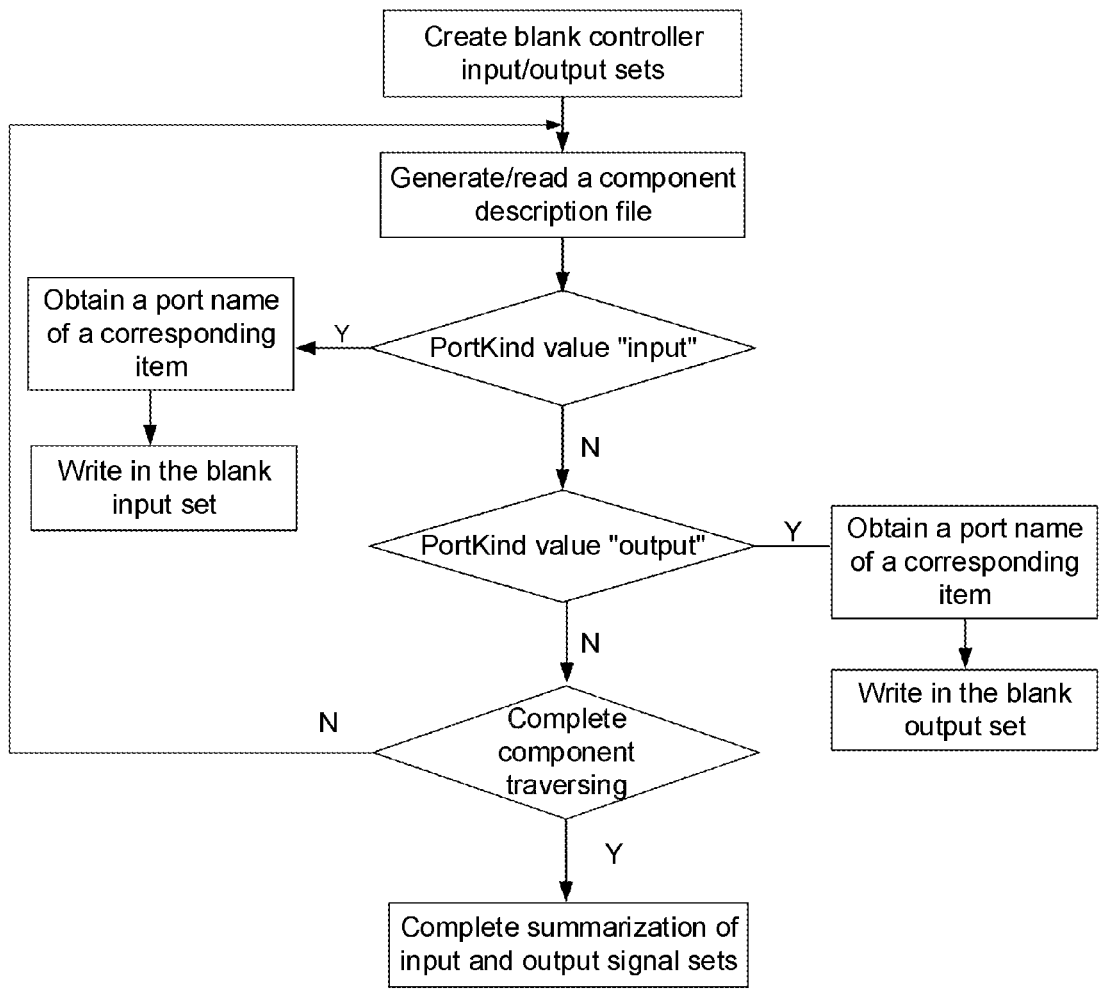
FIG. 4 is a schematic diagram of summarized input and output ports of the user-defined vehicle controller according to an embodiment of the present disclosure.

S3. As shown in FIG. 4, according to the model description file of the components A, B, and C in step S2, the model input and output signals of the components A, B, and C are summarized, and an input signal set {K1,K2,K3,K4,K5,K6,K7,K8} and an output signal set {K4,K5,K6,K7,K8,K9,K1,K2} are obtained.

S4. A difference set between the input signal set and the output signal set is obtained, and the unmatched demand input signal {K3} is taken as the output signal of the user-defined vehicle controller.

S5. The output signal set {K4,K5,K6,K7,K8,K9,K1,K2} is taken as an alternative input signal set of the user-defined vehicle controller, and the signals {K1,K4} are selected as the input signals of the user-defined vehicle controller.

S6. The parameter names {A1,A2,B1,B2,C1} in the component model parameter description file are summarized into a parameter set for building the user-defined vehicle controller, and the parameter names {A1,B2,C1} are selected as the demand parameters of the user-defined vehicle controller.

Figure 5:
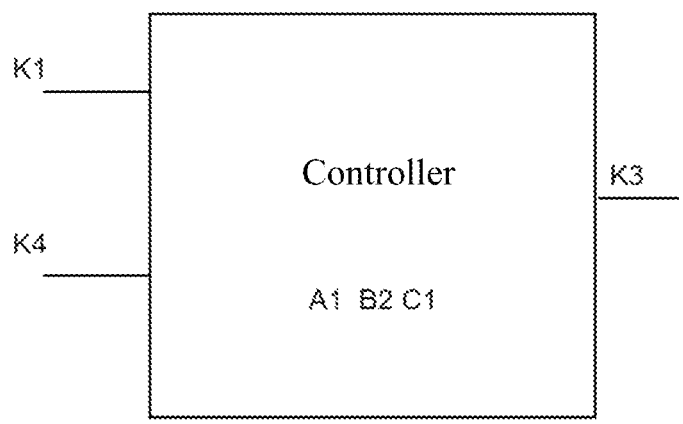
FIG. 5 is a schematic diagram of the user-defined vehicle controller after first creation according to an embodiment of the present disclosure.

S7. A port model template is created on the vehicle simulation platform based on the output signal {K3} of the user-defined vehicle controller obtained in step S4 and the input signals {K1,K4} of the user-defined vehicle controller obtained in step S5. According to the port model template and the demand parameters {A1, B2,C1} of the user-defined vehicle controller obtained in step S6, the user builds the control policy model template in the vehicle controller through the input signals {K1,K4} and parameters {A1,B2,C1}. Finally, the signal {K3} is output to complete the first creation of the user-defined vehicle controller, as shown in FIG. 5.

S8. After the first creation of the user-defined vehicle controller is completed, input signal configuration of the user-defined vehicle controller is checked before each overall vehicle simulation covering all components.

S9. It is determined whether the user has added, deleted or replaced the input signal of the user-defined vehicle controller. If yes, only the input signal of the built user-defined vehicle controller is synchronously modified on the vehicle simulation platform, and the control policy model template freely built by the user according to the actual needs in step S7 is not be deleted. If not, the user-defined vehicle controller is not modified.

The above described are merely preferred embodiments of the present disclosure, and not intended to limit the present disclosure. Any modifications, equivalent replacements and improvements made within the spirit and principle of the present disclosure should all fall within the scope of protection of the present disclosure.

What is claimed is:

1. An automatic modeling method for a user-defined vehicle controller, comprising the following steps:

S1: selecting and configuring, on a graphical user interface (GUI) of a vehicle simulation platform, all component models of a vehicle model except a vehicle controller, and completing component connection and parameter configuration;

S2: generating a component model description file and a component model parameter description file based on the component models configured in step S1;

S3: summarizing input signals and output signals of the component models based on the component model description file generated in step S2, and obtaining an input signal set and an output signal set;

S4: calculating a difference set between the input signal set and the output signal set obtained in step S3, wherein the difference set is an unmatched demand input signal set in all the component models of the vehicle model except the vehicle controller selected in step S1, and the unmatched demand input signal set is defined as an output signal set of the user-defined vehicle controller;

S5: taking the output signal set in step S4 as an alternative input signal set of the user-defined vehicle controller, and selecting, by a user, one or more signals in the input signal set as input signals of the user-defined vehicle controller;

S6: summarizing, based on the component model parameter description file generated in step S2, parameter names in the component model parameter description file into a parameter set for building the user-defined vehicle controller, and selecting, by the user, one or more parameters in the parameter set as demand parameters of the user-defined vehicle controller;

S7: creating a port model template on the vehicle simulation platform based on steps S4 and S5, creating a control policy model template based on the demand parameters of the user-defined vehicle controller selected in step S6 and an actual need of the user, and completing first creation of the user-defined vehicle controller based on the port model template and the control policy model template; and S8: checking, after the first creation of the user-defined vehicle controller is completed, input signal configuration of the user-defined vehicle controller before each overall vehicle simulation covering all components.

2. The automatic modeling method according to claim 1, wherein in step S1, the vehicle simulation platform is plug-and-play, modularizes the component models, and comprises the GUI for placing and connecting demand components.

3. The automatic modeling method according to claim 1, wherein in step S2, the component models each comprise the input signals, the output signals, and parameters, the component model description file refers to a file that describes the input signals and output signals of the component models; and the component model parameters description file refers to a file that describes parameters for ensuring normal operation of the component models and basic attributes of all the parameters.

4. The automatic modeling method according to claim 1, wherein in step S4, the unmatched demand input signal means that a demand input signal of a component is not provided by an output signal of any other component.

5. The automatic modeling method according to claim 1, wherein in step S7, the creating a port model template comprises:

A1: determining input and output serial numbers and input and output names of the port model template according to the output signal set of the user-defined vehicle controller obtained in step S4 and the input signals of the user-defined vehicle controller selected by the user in step S5;

A2: connecting, based on step A1, signals of a same name between all the components, except the vehicle controller, and the port model template, and completing the creation of the port model template; and A3: saving the port model template.

6. The automatic modeling method according to claim 1, wherein in step S8, the checking input signal configuration of the user-defined vehicle controller before each overall vehicle simulation covering all components comprises:

B1: summarizing current input signals of the user-defined vehicle controller;

B3: determining, based on step B1, whether current input signal configuration of the user-defined vehicle controller is consistent with previous configuration; and B4: if there is no difference in the input signal configuration, not operating, and simulating based on an original user-defined vehicle controller; and if an input signal is added, deleted or replaced, modifying the input signals of the built user-defined vehicle controller automatically and synchronously, and not deleting the control policy model template freely built by the user according to the actual need in step S7.

* * * * *